(12) United States Patent
Hatch

(10) Patent No.: US 10,314,176 B2
(45) Date of Patent: Jun. 4, 2019

(54) CONTACT ASSEMBLY

(71) Applicant: Honeywell Federal Manufacturing & Technologies, LLC, Kansas City, MO (US)

(72) Inventor: Stephen McGarry Hatch, Blue Springs, MO (US)

(73) Assignee: Honeywell Federal Manufacturing & Technologies, LLC, Kansas City, MO (US)

( * ) Notice: Subject to any disclaimer, the term of this patent is extended or adjusted under 35 U.S.C. 154(b) by 1457 days.

(21) Appl. No.: 13/736,696

(22) Filed: Jan. 8, 2013

(65) Prior Publication Data
US 2014/0190005 A1 Jul. 10, 2014

(51) Int. Cl.
| | |
|---|---|
| *H05K 3/22* | (2006.01) |
| *H01R 13/193* | (2006.01) |
| *H01R 13/24* | (2006.01) |
| *H01R 13/41* | (2006.01) |
| *H05K 1/18* | (2006.01) |
| *G01R 1/04* | (2006.01) |
| *H01R 12/70* | (2011.01) |
| *H01R 12/71* | (2011.01) |
| *H05K 3/32* | (2006.01) |
| *G01R 27/02* | (2006.01) |

(52) U.S. Cl.
CPC ............. *H05K 3/22* (2013.01); *G01R 1/0416* (2013.01); *H01R 13/193* (2013.01); *H01R 13/24* (2013.01); *H01R 13/41* (2013.01); *H05K 1/184* (2013.01); *G01R 27/02* (2013.01); *H01R 12/7082* (2013.01); *H01R 12/714* (2013.01); *H01R 2201/20* (2013.01); *H05K 3/325* (2013.01); *H05K 2201/1059* (2013.01); *H05K 2201/10189* (2013.01); *H05K 2201/10962* (2013.01); *Y10T 29/49124* (2015.01)

(58) Field of Classification Search
None
See application file for complete search history.

(56) References Cited

U.S. PATENT DOCUMENTS

| 4,118,094 A * | 10/1978 | Key | H01R 12/87 439/327 |
|---|---|---|---|
| 4,189,200 A * | 2/1980 | Yeager | H01R 12/88 439/267 |

(Continued)

FOREIGN PATENT DOCUMENTS

CN 2351886 12/1999

*Primary Examiner* — Paresh H Patel
(74) *Attorney, Agent, or Firm* — Hovey Williams LLP

(57) ABSTRACT

An electrical contact assembly includes an electrically non-conductive base, a first electrical contact supported by the base and a second electrical contact supported by the base such that the first contact and the second contact are separated by a space. The first electrical contact is configured to engage a first external conductive circuit element and the a second electrical contact is configured to engage a second external conductive circuit element. The first contact and the second contact are configured such that a portion of the first contact and a portion of the second contact converge as the base moves in a first direction relative to the first and second external conductive circuit elements and diverge as the base moves in a second direction relative to the first and second external conductive circuit elements.

21 Claims, 5 Drawing Sheets

(56) References Cited

U.S. PATENT DOCUMENTS

| | | | | |
|---|---|---|---|---|
| 4,221,448 | A | * | 9/1980 | Logerot .................. H01R 12/82 439/260 |
| 4,509,099 | A | * | 4/1985 | Takamatsu ......... H01R 13/2414 361/749 |
| 4,593,961 | A | * | 6/1986 | Cosmo ................. H05K 7/1061 439/260 |
| 4,629,270 | A | * | 12/1986 | Andrews, Jr. .......... H01R 12/89 439/260 |
| 4,684,193 | A | | 8/1987 | Havel |
| 4,762,500 | A | * | 8/1988 | Dola .................... H01R 23/688 439/101 |
| 4,894,022 | A | * | 1/1990 | Guckenheimer ...... H01R 12/87 439/260 |
| 4,897,045 | A | | 1/1990 | Dyck |
| 5,781,096 | A | * | 7/1998 | Yasukuni ........... H01H 85/0411 337/161 |
| 6,257,911 | B1 | | 7/2001 | Shelby et al. |
| 7,271,606 | B1 | | 9/2007 | Tang et al. |

* cited by examiner

CONTACT ASSEMBLY

GOVERNMENT INTERESTS

The present invention was developed with support from the U.S. government under a contract with the United States Department of Energy, Contract No. DE-NA0000622. Accordingly, the U.S. government has certain rights in the present invention.

BACKGROUND

1. Field

Embodiments of the present invention relate to electrical connectors. More particularly, embodiments of the present invention relate to dual contact electrical connectors configured to minimize physical damage associated with repeated use.

2. Related Art

Four-wire sensing is a technique used to measure impedance in a circuit under test. Four-wire sensing involves using two sets of wires to take measurements instead of a single set of wires. A first pair of wires, sometimes referred to as the "force" wires, supplies current to the circuit under test. A second pair of wires, sometimes referred to as the "sense" wires, is connected to the circuit under test and used to measure impedance. Four-wire impedance testing is typically more accurate than two-wire impedance testing because very little or no current flows through the sense wires, thereby reducing or eliminating the voltage drop across the sense wires that may affect measurements.

Kelvin type connectors may be used with four-wire sensing circuits. Kelvin type connectors include two electrical contacts integrated into a single connector housing and configured to contact a single conductive element at two different points, thus eliminating the need for two separate connectors attached to the conductive element. Because each Kelvin type connector includes two contacts, a single pair of Kelvin type connectors can be used to complete a four-wire sensing circuit. Kelvin type connectors are especially useful in applications that require four-wire sensing circuits to be repeatedly and frequently connected and disconnected. One example of this type of application is circuit manufacturing and/or testing processes, where four-wire sensing circuits may be connected and disconnected from circuits under test hundreds or even thousands of times each day.

Unfortunately, repeated and frequent use of electrical connectors damages the connectors over time. Such damage may occur in elements of the connectors that frequently rub against other elements, such as electrical contacts that engage and rub against other electrical contacts as connections are made and as connectors are separated. This type of situation may occur where a first connector slides into friction-fit engagement with another connector or circuit element each time a connection is made and slides out of engagement each time the components are separated. Accordingly, there is a need for a device which overcomes the limitations described above.

SUMMARY

Embodiments of the present invention solve the above-described problems by providing a contact assembly that reduces or eliminates the damage described above.

A contact assembly in accordance with an embodiment of the invention comprises a base formed at least partially of an electrically nonconductive material, a first electrical contact supported by the base and configured to engage a first external circuit element, and second electrical contact supported by the base and configured to engage a second external circuit element, the second electrical contact being separated from the first electrical contact by a space. The first contact and the second contact are configured such that a portion of the first contact and a portion of the second contact converge as the base moves in a first direction relative to the first and second external circuit elements and diverge as the base moves in a second direction relative to the first and second external circuit elements.

The electrical contacts are configured to engage a conductive element, such as a connector pin, in a manner that minimizes sliding or rubbing movement between the electrical contacts and the conductive element, thus minimizing wear on the electrical contacts and prolonging the life of the contact assembly.

A printed circuit board in accordance with another embodiment of the invention comprises a plurality of apertures and a plurality of conductive pads positioned on the printed circuit board such that a pair of conductive pads is associated with each aperture. Each pair of conductive pads includes a first conductive pad and a second conductive pad positioned on opposing sides of one of the apertures.

The printed circuit board further comprises a plurality of contact assemblies. Each of the contact assemblies is slidably positioned in one of the apertures and includes an electrically nonconductive base positioned at least partially in the aperture, a first metal contact supported by the base and a second metal contact supported by the base. The first contact is a strip of metal with a first segment rigidly secured to the base, a second segment engaging the first conductive pad and forming an electrical connection with the pad, and a plurality of intermediate segments between the first and second segments. The second metal contact is a strip of metal with a first segment rigidly secured to the base, a second segment engaging the second conductive pad and forming an electrical connection with the pad, and a plurality of intermediate segments between the first and second segments.

The first contact and the second contact are configured such that at least one of the intermediate segments in each contact flexes to allow the base to shift relative to the printed circuit board, and at least one of the intermediate segments of the first contact and at least one of the intermediate segments of the second contact converge as the base moves in a first direction relative to the circuit board and diverge as the base moves in a second direction relative to the circuit board.

A method in accordance with yet another embodiment of the invention comprises placing a contact assembly in an aperture of a circuit board such that an electrically nonconductive base of the contact assembly is positioned at least partially in the aperture and each of two separate electrical contacts of the contact assembly engages a separate conductive pad on the circuit board. A pin-type connector is connected to the contact assembly by inserting a pin of the connector between the two electrical contacts of the receptacle such that the pin engages the base without contacting either of the two electrical contacts.

The connector and the contact assembly are moved in a first direction relative to the circuit board, causing the two electrical contacts to flex such that a portion of each contact converges on the pin and contacts the pin without contacting the other contact and without sliding on the pin. After the two electrical contacts initially make contact with the pin, the connector is moved further in the first direction, causing the two electrical contacts to flex further without sliding on the pin.

This summary is provided to introduce a selection of concepts in a simplified form that are further described below in the detailed description. This summary is not intended to identify key features or essential features of the claimed subject matter, nor is it intended to be used to limit the scope of the claimed subject matter. Other aspects and advantages of the present invention will be apparent from the following detailed description of the preferred embodiments and the accompanying drawing figures.

Figure 1:
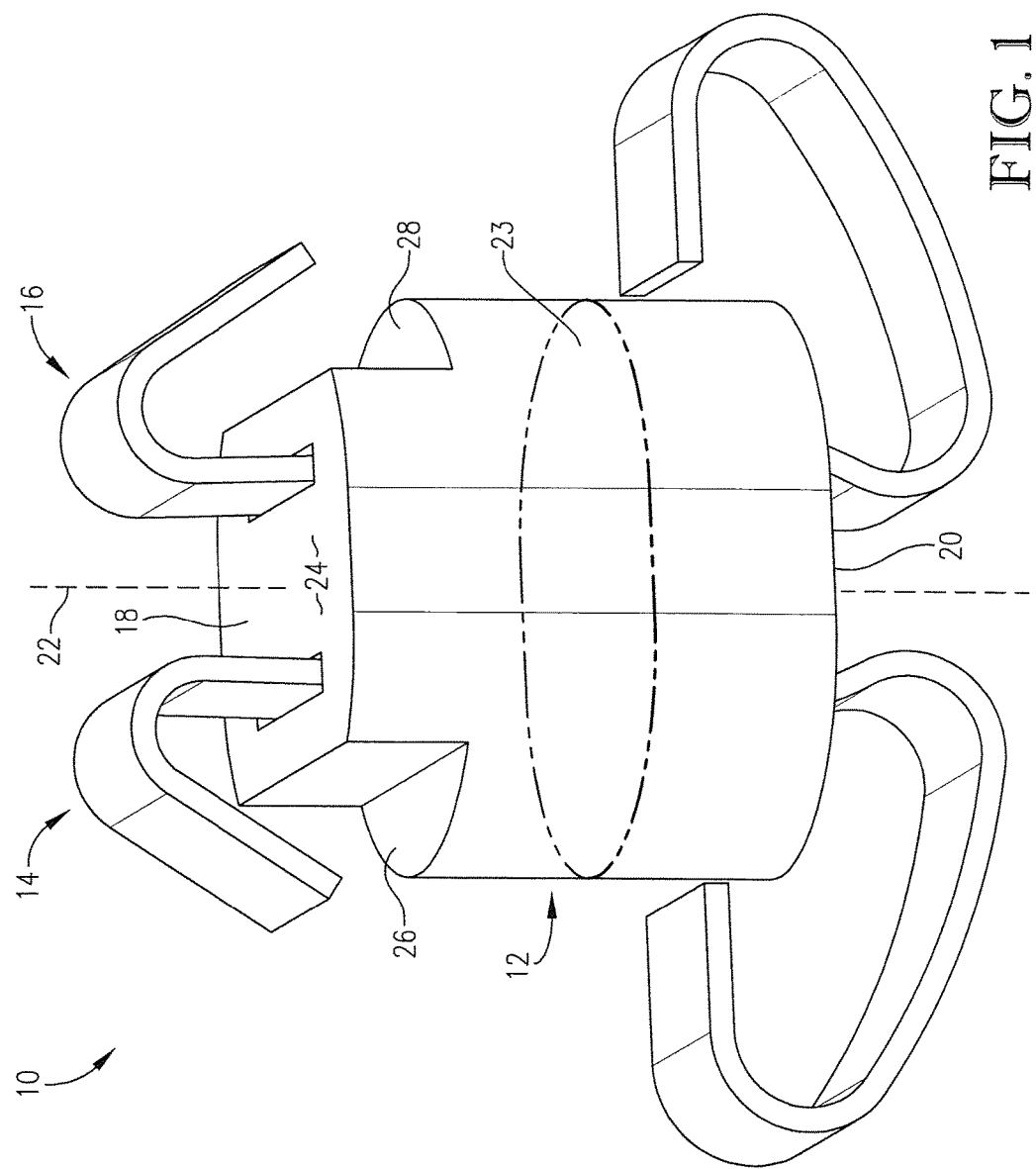
FIG. 1 is an isometric view of a contact assembly constructed in accordance with embodiments of the invention, the contact assembly including a base supporting a pair of electrical contacts.

The drawing figures do not limit the present invention to the specific embodiments disclosed and described herein. The drawings are not necessarily to scale, emphasis instead being placed upon clearly illustrating the principles of the invention.

DETAILED DESCRIPTION

The following detailed description references the accompanying drawings that illustrate specific embodiments in which the invention may be practiced. The embodiments are intended to describe aspects of the invention in sufficient detail to enable those skilled in the art to practice the invention. Other embodiments can be utilized and changes can be made without departing from the scope of the present invention. The following detailed description is, therefore, not to be taken in a limiting sense. The scope of the present invention is defined only by the appended claims, along with the full scope of equivalents to which such claims are entitled.

In this description, references to "one embodiment", "an embodiment", or "embodiments" mean that the feature or features being referred to are included in at least one embodiment of the technology. Separate references to "one embodiment", "an embodiment", or "embodiments" in this description do not necessarily refer to the same embodiment and are also not mutually exclusive unless so stated and/or except as will be readily apparent to those skilled in the art from the description. For example, a feature, structure, act, etc. described in one embodiment may also be included in other embodiments, but is not necessarily included. Thus, the present technology can include a variety of combinations and/or integrations of the embodiments described herein.

Figure 2:
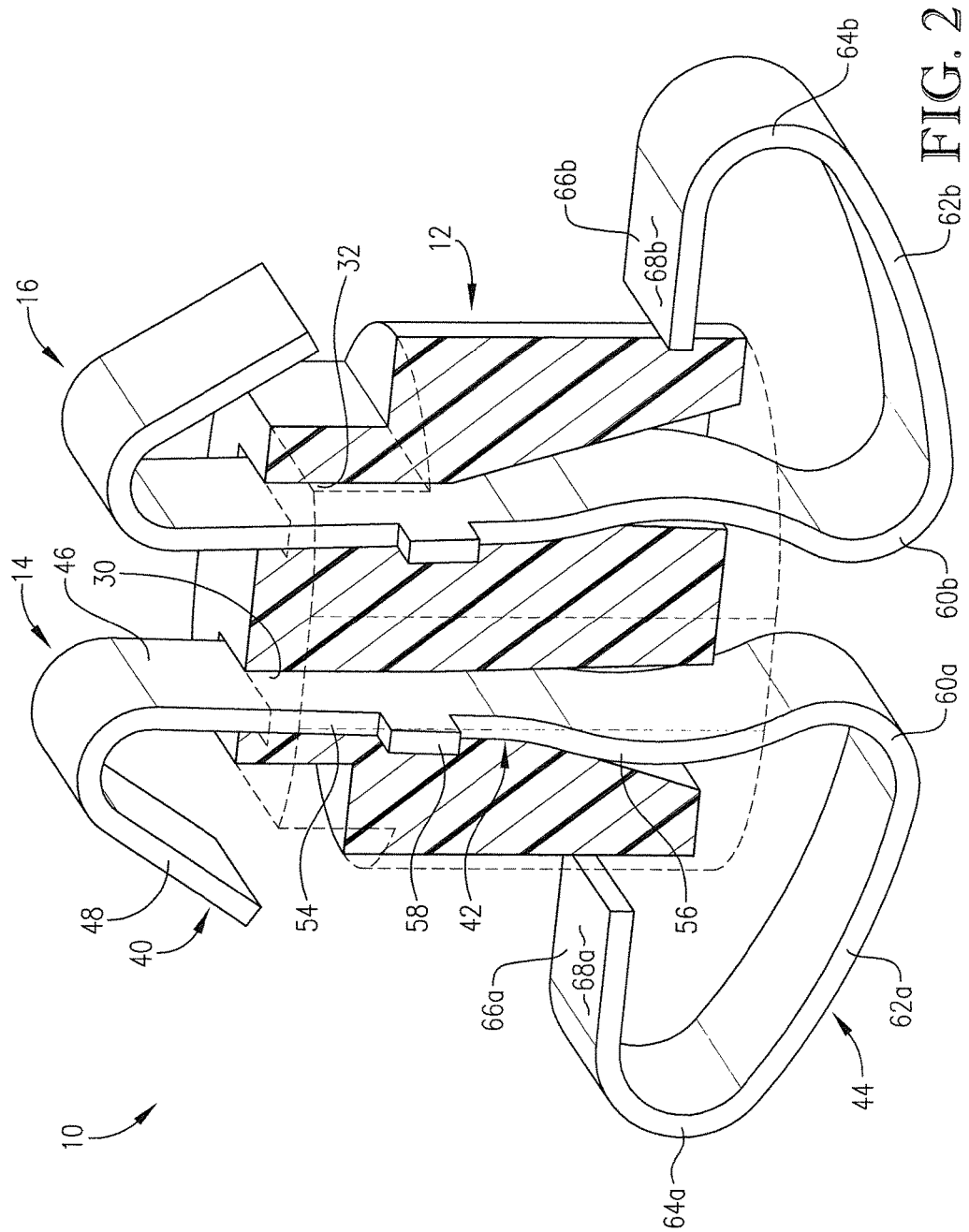
FIG. 2 is a first cross-sectional view of the contact assembly of FIG. 1.
Figure 3:
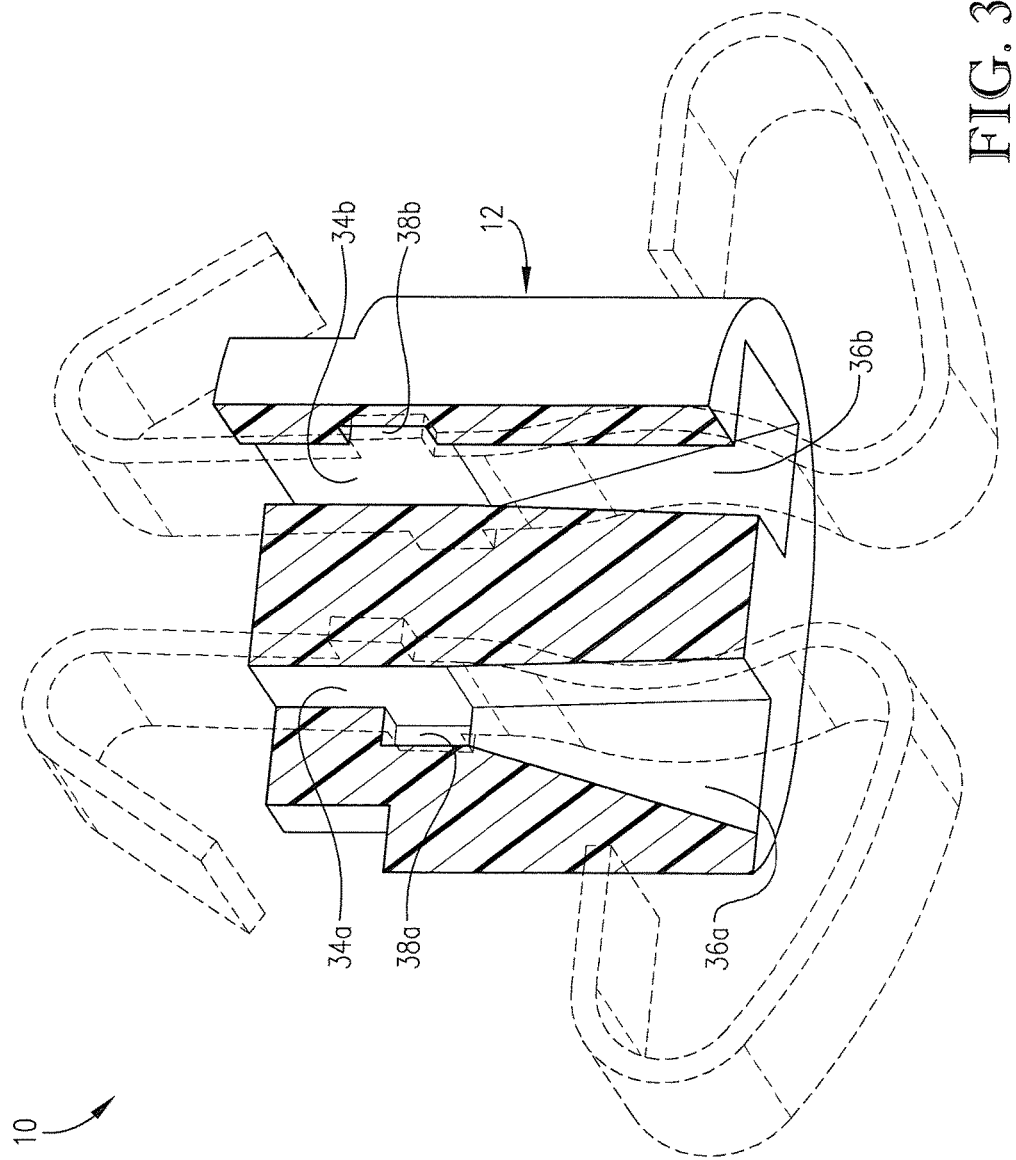
FIG. 3 is a second cross-sectional view of the contact assembly of FIG. 1.

Referring now to the drawings, wherein like reference numerals designate identical or corresponding parts throughout the several views, a contact assembly 10 constructed in accordance with embodiments of the invention is illustrated. With particular reference to FIGS. 1-3, the contact assembly 10 broadly includes a base 12 and a pair of electrical contacts 14, 16 supported by the base 12. The contact assembly 10 is configured such that the two electrical contacts 14, 16 can each be coupled with external circuit element, such as a conductive pad on a printed circuit board, and also simultaneously couple with a single connector element, such as a metal pin of an electrical connector. The electrical contacts 14, 16 engage the connector element in a manner that minimizes sliding or rubbing movement between the electrical contacts 14, 16 and the connector element, thus minimizing wear on the electrical contacts 14, 16 and prolonging the life of the contact assembly 10.

The base 12 is constructed at least in part of an electrically nonconductive material, such as plastic, so that each of the electrical contacts 14, 16 is electrically isolated from the other. In the illustrated embodiment, the base 12 includes a first end 18 and a second end 20 separated along a first axis 22. A cross section 23 of the base 12 perpendicular to the first axis 22 presents an elliptical or nearly elliptical shape. A length of the base 12 corresponds to the major axis of the elliptical cross section 23 and a width of the base 12 corresponds to the minor axis of the elliptical cross section 23. The first end 18 of the base 12 presents a flat surface 24 with recessed end portions 26, 28 corresponding to opposing ends of the major axis of the elliptical cross section and defining opposing shoulders. The second end 20 is substantially flat and presents the same elliptical shape as the cross section 23. The first end 18 of the base 12 is also referred to herein as the "top" or "upper" portion of the base 12, and the second end 20 is also referred to herein as the "bottom" or "lower" portion of the base.

While in the illustrated embodiment the base 12 presents an elliptical shape and, more specifically, an oval shape, the invention is not so limited. The base 12 may present virtually any shape including, for example, a round shape or a rectangular shape. It will be appreciated by those skilled in the art that the particular shape of the base 12 may vary from one embodiment of the invention to another without departing from the scope of the invention.

The base 12 includes slots, apertures or other mounting elements for supporting the electrical contacts. In the illustrated embodiment, the base 12 includes a pair of parallel slots 30, 32 extending from the first end 18 of the base 12 to the second end 20 of the base 12 and generally parallel with the first axis 22. The slots 30, 32 are configured to secure the electrical contacts 14, 16 in a fixed relationship one to another while allowing portions of each of the contacts 14, 16 to flex inwardly (toward one another) and outwardly (away from one another) during use, as explained below. More particularly, each slot 30, 32 includes a narrow upper portion 34 and a broadening lower portion 36. The narrow upper portion 34 of each slot 30, 32 corresponds to the first end 18 and rigidly secures a segment of the respective electrical contact 14, 16. The broadening lower portion 36 of each slot 30, 32 corresponds to the second end 20 and accommodates movement of a portion of the respective electrical contact 14, 16 during operation of the contact assembly 10.

The narrow upper portion 34 of each slot 30, 32 presents a rectangular cross section with width and depth that are generally uniform along the upper portion 34, except for one or more retention recesses 38 configured to engage corresponding retention elements of the electrical contacts 14, 16. The one or more retention recesses 38 may be positioned within the base 12 at or proximate a lower end of the upper portion 34 of the slots 30, 32 may extend laterally (that is, along a line that is parallel with the minor axis of the elliptical cross section 23) from the slots 30, 32, and may be configured to receive a corresponding retention tab of the electrical contacts 14, 16 to prevent the electrical contacts 14, 16 from shifting relative to the base 12.

The broadening lower portion 36 of each slot 30, 32 extends from the narrow upper portion 34 to the second end 20 of the base 12. The broadening lower portion 36 presents a generally uniform width and a depth that gradually increases between the upper portion 34 of the slots 30, 32 and the second end 20 of the base 12. As illustrated in FIGS. 4-7, the broadening lower portions 36 accommodate movement of a portion of each of the electrical contacts 14, 16 along a direction that corresponds to the length of the base 12. The total depth of the lower portion of each slot 30, 32 at the second end 20 of the base 12 is approximately one-fourth of the total length of the base 12. The height of the upper portion 34 of each slot 30, 32 is approximately forty percent of the total height of the slot 30, 32, while the height of the lower portion 36 is approximately sixty percent of the total height.

Figure 4:
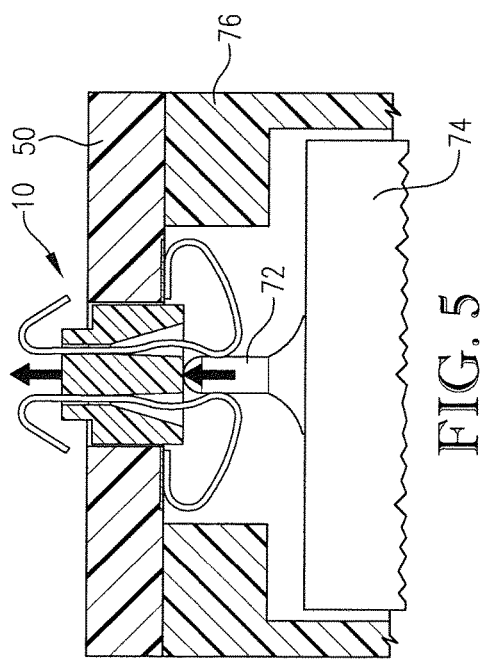
FIG. 4 is a side elevation cross-sectional view of the contact assembly of FIG. 1 and of a circuit board to which the contact assembly is attached, and further including a fragmentary view of an external connector, the contact assembly and the external connector being in a first position relative to the circuit board.

The electrical contacts 14, 16 may be identical in form and function, therefore only a first contact 14 is described in detail herein with the understanding that the second contact 16 may be identically configured. The electrical contact 14 is made of an electrically conductive material, such as a strip of metal, and broadly includes a top portion 40, a middle portion 42 and a bottom portion 44. The top portion 40 extends beyond the top 18 of the base 12 and is configured to retain or help retain the contact assembly in a circuit board 50 or similar structure. The top portion 40 includes a first segment 46 extending from the first end 18 of the base 12 in a direction that is generally parallel with the first axis 22 and a retention segment 48 extending outwardly and at an angle relative to the first segment 46. More particularly, the retention segment 48 extends downwardly (toward the base) and outwardly (away from the second electrical contact 16) beyond a periphery of the top 18 of the base 12 along a direction that is generally parallel with the length of the base 12. As illustrated in FIG. 4, this configuration allows the retention element 48 to engage the circuit board 50 and prevent the contact assembly 10 from sliding through an aperture 52 in the circuit board 50 in which the assembly 10 is mounted.

The middle portion 42 of the electrical connector 14 is positioned within the slot 30 and at least partially engages the base 12. The middle portion 42 includes a generally straight top segment 54 corresponding to the narrow upper portion 34 of the slot 30 and an arcuate bottom segment 56 corresponding to the broadening lower portion 36 of the slot 30. The arcuate bottom segment 56 is configured to flex and move within the lower portion 36 of the slot 30 during use to allow the electrical contacts 14, 16 to receive and engage a connector pin without sliding relative to the surface of the pin. The top segment 54 includes one or more retention elements 58 configured to engage the retention recesses 38 in the upper portion 34 of the slot 30 and prevent the electrical contact 14 from shifting relative to the base 12. The one or more retention elements 58 generally extend laterally from the electrical contact into the recesses 38 and may be rectangular in shape, as illustrated.

The bottom portion 44 of the electrical contact 14 extends from the second end 20 of the base 12, is positioned below and to the side of the base 12 and is configured to engage the circuit board 50 and flex as the contact assembly 10 moves relative to the circuit board 50. As explained below in greater detail, the bottom portion 44 of the electrical contact 14 generally flexes inwardly or toward the second 16 contact as the base 12 moves into the circuit board 50 (upward in FIGS. 4-7), and flexes outwardly or away from the second contact 16 as the base 12 moves out of the circuit board 50 (downward in FIGS. 4-7). Thus, the electrical contacts 14, 16 converge and engage a pin or other connector element positioned between the contacts 14, 16 as the base 12 moves into the circuit board 50, and diverge and disengage the pin as the base 12 moves out of the circuit board 50.

The bottom portion 44 of the electrical contact 14 includes a first rounded segment 60 adjacent the bottom segment 56 of the middle portion 42, a straight or slightly curved connecting segment 62 that extends at an angle upwardly and away from the first rounded segment 60, a second rounded segment 64 in opposing relationship to the first rounded segment 60, and an end segment 66 extending from the second rounded segment 64 toward the base 12.

The first rounded segment 60 of the bottom portion 44 of the electrical contact 14 is the segment of the electrical contact 14 that is closest to the second electrical contact 16 and is the segment that engages a pin positioned between the two contacts 14, 16. A top surface 68 of the end segment 66 engages a circuit element 70 of the circuit board 50, such as a conductive pad, and makes an electrical connection with the circuit element 70 of the circuit board 50. The top surface 68 of the end segment 66 may be soldered or otherwise fixedly secured to the circuit element 70. Alternatively, the top surface 68 of the end segment 66 may engage the circuit element 70 without being secured thereto in a free-floating configuration. In the illustrated embodiment, the top surface 68 of the end segment 66 is flat or substantially flat and perpendicular to the first axis 22.

The first 60 and second 64 rounded segments of the bottom portion 44 enable the electrical contact 14 to flex when the contact assembly 10 shifts into the circuit board. The flexing motion of the electrical contacts 14, 16 not only accommodates movement of the contact assembly 10 relative to the circuit board 50, but also enables the inward movement of the first rounded segments 60 of the electrical contacts 14, 16 as the contact assembly 12 moves into the circuit board 50. In other words, as the contact assembly 12 moves into the circuit board 50, the electrical contacts 14, 16 flex such that the first rounded segment 60 moves upward with the base 12 and also inward (toward the opposing electrical contact). Similarly, as the contact assembly 10 moves downward and out of the circuit board 50, the electrical contacts 14, 16 flex such that the first rounded segment 60 moves downward with the base 12 and also outward (away from the opposing electrical contact). Operation of the contact assembly 10 is described below in greater detail.

Thus, in one embodiment of the present invention, the top segment 54 of the middle portion 42 is rigidly secured to the base 12, the end segment 66 of the bottom portion 44 engages the circuit board 50, and a plurality of intermediate segments and bends of the electrical contact 14 interconnect the segment 54 secured to the base 12 and the segment 66 secured to the circuit board 50. This configuration allows the electrical contact 14 to flex as described above when the base 12 moves relative to the circuit board 50. It will be appreciated that the size and shape of the various segments may vary from one embodiment of the invention to another without departing from the spirit or scope of the invention.

While the particular size, shape and proportions of the contact assembly 10 may vary from one embodiment of the invention to another without departing from the scope of the invention, certain dimensions and proportions are provided herein with the understanding that such dimensions and proportions are exemplary, and not limiting, in nature. In one embodiment of the invention, the height of the base 12 (the distance between the first end 18 and the second end 20) may be about 0.10 inches and the length of the base 12 may be about 0.1150 inches. The ratio of the length of the base 12 to the width of the base 12 may be between two and five.

The top segment 54 of the middle portion 42 of the electrical contact 14, the bottom segment 56 of the middle portion 42, and the connecting segment 62 of the bottom portion 44 may all be approximately the same length. The end segment 66 of the bottom portion 44 may be about one-half the length of the connecting segment 62. The radius of curvature of each of the first 60 and second 64 rounded segments of the bottom portion 44 may be about one-half of the length of the end segment 66.

A total height of each electrical contact 14, 16 (in a direction parallel with the first axis 22) may be about 0.20 inches. The distance between the first bend 60 and the second bend 64 of the bottom portion 44 may be about 0.10 inches. The distance between the top portions 40 of the electrical contacts 14, 16 may be about 0.035 inches. The radius of curvature of the first bend 60 and the second bend 64 may be about 0.015 inches.

Figure 8:
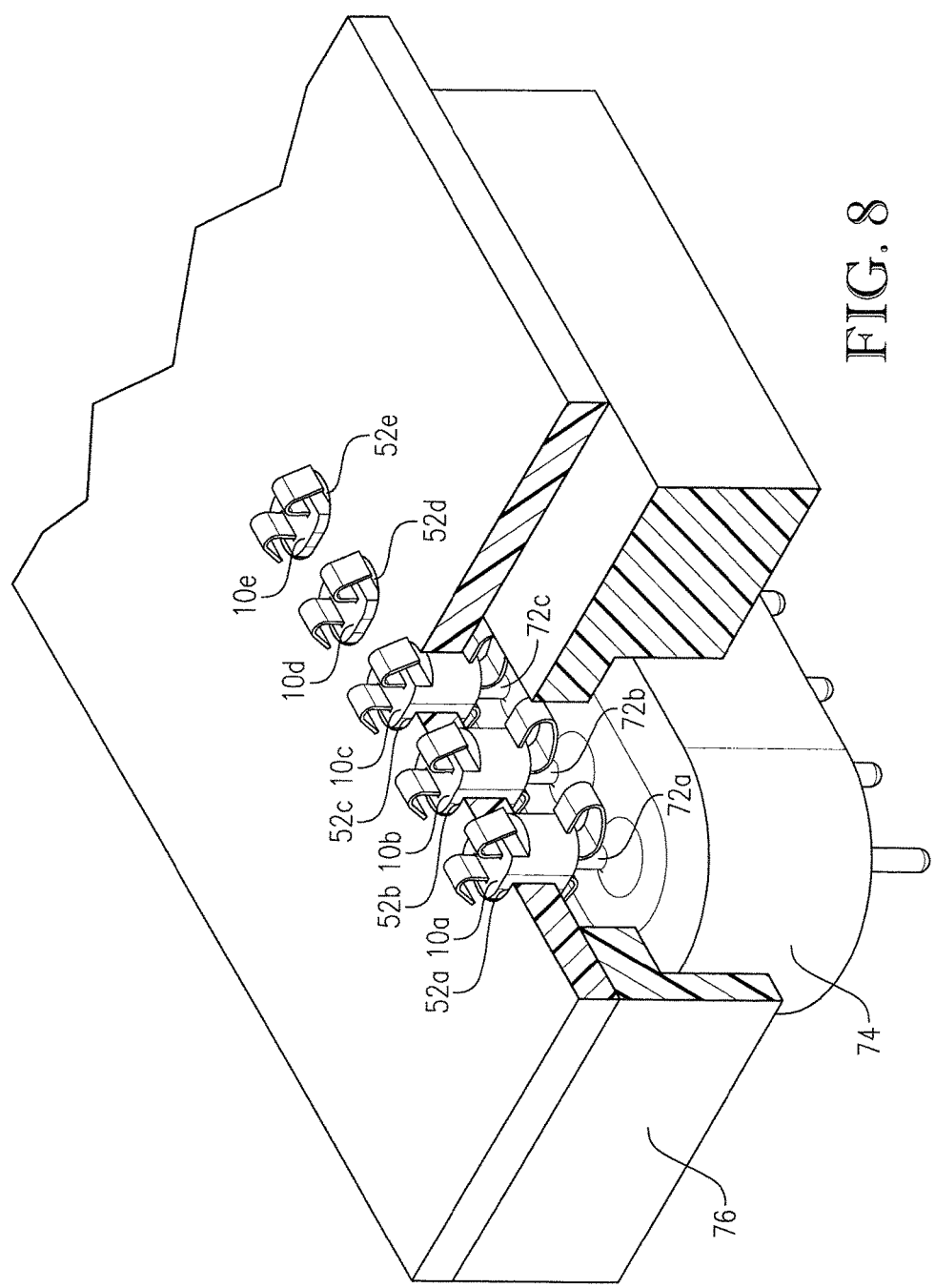
FIG. 8 is a perspective view of a circuit board with a plurality of contact assemblies similar or identical to the contact assemblies of FIG. 1 mounted on the circuit board, and an external connector with a plurality of pins engaging the contact assemblies.

Turning now to FIG. 8, an exemplary implementation of the contact assembly 10 is illustrated wherein a plurality of contact assemblies 10a-e are mounted on the circuit board 50 in a linear arrangement. The contact assemblies 10a-e may be positioned on the circuit board 50 to form a pattern that corresponds to an array of pins 72 associated with a connector 74 that is configured to engage the contact assemblies 10a-e. The illustrated implementation may be used, for example, to test the impedance of the connector 74 or a circuit associated with the connector 74.

The circuit board 50 may be a printed circuit board and includes a plurality of apertures 52 with one of the contact assemblies 10a-e slidably disposed within each aperture 52. A plurality of conductive pads 70 are positioned on the circuit board 50 such that a pair of conductive pads 70 is associated with each aperture 52. Each pair of conductive pads 70 includes a first conductive pad 70a and a second conductive pad 70b positioned on opposing sides of the respective aperture 70. The contact assemblies 10 are positioned such that the electrical contacts 14, 16 make electrical connections with the conductive pads 70. The electrical contacts 14, 16 form an electrical connection with the pads 70 if electrical signals can pass between the pads 70 and the contacts 14, 16. The electrical contacts 14, 16 may be fixedly attached (e.g., soldered) to the pads 70 or may be free floating. The pads 70 will typically be part of a larger circuit, such as a four-wire sensing circuit.

While the illustrated embodiment includes five apertures 52 in a generally linear configuration, it will be appreciated that any number of apertures and corresponding contact assemblies may be arranged in virtually any configuration on the circuit board 10 without departing from the scope of the invention. By way of example, the circuit board 50 may include two or more parallel rows of apertures, the rows being uniform or non-uniform in size and spacing. The pattern of apertures will generally correspond to the pattern of pins on a connector adapted to mate with the contact assemblies 10.

Each contact assembly 10 may be mounted on the circuit board 50 by inserting the contact assembly 10 through one of the apertures 52 in the direction of the arrows in FIG. 4. The retention segments 48 of the electrical contacts 14, 16 may engage the walls of the aperture 52 and bend inwardly as the contact assembly 10 moves through the aperture 52. Because the retention segments 48 extend downwardly, they impart little, if any, resistance to the movement of the contact assembly 10 through the aperture 52. However, once the retention segments 48 clear the circuit board 50, as illustrated in FIG. 4, they relax to their normal and unrestrained positions and prevent the contact assembly 10 from moving out of the aperture 52 in a direction opposite the arrows in FIG. 4. When each contact assembly is mounted in one of the apertures, the end segments 66 of the electrical connectors 14, 16 contact the circuit elements 70 associated with the aperture 52 on a first side 78 of the circuit board 50 and the retention segments 48 clear a second side 80 of the circuit board 50. The end segments 66 of the electrical connectors 14, 16 may be soldered or otherwise fixedly attached to the conductive circuit elements 70, or may be free-floating.

A connection structure 76 is mounted on the circuit board 50 proximate the apertures 52 and contact assemblies 10. The connection structure 76 is configured to physically engage the external connector 74 to guide the external connector 74 into engagement with contact assemblies 10, to stop the external connector 74 when the connection is complete, and to secure the external connector 74 in place once a connection is made.

With particular reference to FIGS. 4-7, use of the contact assembly 10 and the circuit board 50 is illustrated. More particularly, FIGS. 4-7 illustrate the actions involved in attaching the external connector 74 to the contact assembly 10 and connection structure 76. While FIGS. 4-7 illustrate a single pin 72 connecting to a single contact assembly 10, it will be understood that multiple pins may be connected to multiple contact assemblies simultaneously.

The external connector 74 is aligned with the connection structure 76 and inserted into the connection structure 76 until the pin 72 engages the base 12 of the contact assembly 10, as illustrated in FIG. 4. It should be noted that at this point the contact assembly 10 is in an open position wherein the electrical contacts 14, 16 are separated one from another sufficiently to allow the pin 72 to be inserted between the electrical contacts 14, 16 and engage the base 12 without contacting either of the electrical contacts 14, 16.

Figure 5:
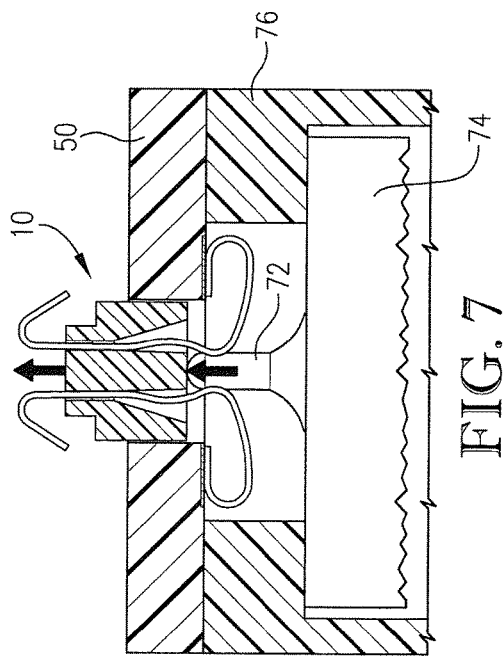
FIG. 5 is a side elevation cross-sectional view similar to FIG. 4, illustrating the contact assembly and the external connector in a second position relative to the circuit board.

As the connector 74 moves further into the structure 76 it pushes the contact assembly 10 into the circuit board aperture 52, as illustrated in FIG. 5. Movement of the contact assembly 10 is enabled by the flexing action of the electrical contacts 14, 16, which bend or otherwise deform to allow the contact assembly 10 to move relative to the circuit board 50.

Figure 6:
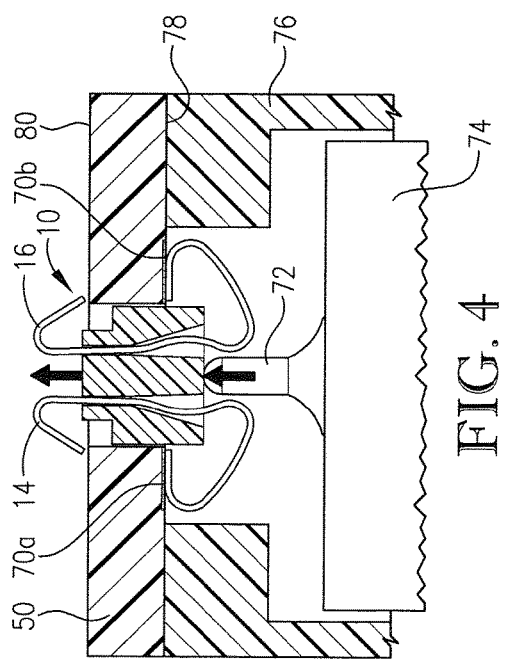
FIG. 6 is a side elevation cross-sectional view similar to FIG. 4, illustrating the contact assembly and the external connector in a third position relative to the circuit board.
Figure 7:
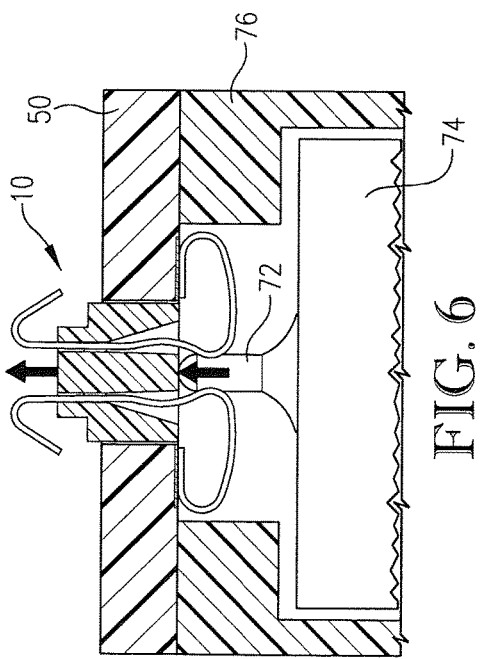
FIG. 7 is a side elevation cross-sectional view similar to FIG. 4, illustrating the contact assembly and the external connector in a fourth position relative to the circuit board.

As the electrical contacts 14, 16 flex in response to the upward movement of the contact assembly 10, they converge and ultimately contact the pin 72 at separate locations on the pin and without contacting each other. In the illustrated embodiment, the electrical contacts 14, 16 contact opposite sides of the pin 72. As the contact assembly 10 and the connector 74 continue to move upward as illustrated in FIGS. 6 and 7, the electrical contacts 14, 16 continue to flex and the pin 72 remains in contact with the contacts 14, 16. Notably, the contacts 14, 16 do not slide on the pin 72 as the connector 74 and the contact assembly 10 move upward and into a locked or closed position (FIG. 7). Rather, the pin 72 and the electrical contacts 14, 16 all move upward together, and the first rounded segment 60 of each contact 14, 16 rolls along the surface of the pin 72.

The connector 74 engages the connection structure 76, which arrests movement of the connector 74 at a predetermined distance from the circuit board 50, as illustrated in FIG. 7. The external connector 74 is disconnected from the array of contact assemblies 10a-e by moving the connector 74 and the contact assembly 10 downward relative to the circuit board 50 until the contact assembly 10 reaches the open position, as illustrated in FIG. 4. Once the contact assembly 10 is in the open position, the electrical contacts 14, 16 are separated from the pin 72 and the pin 72 may be removed from the contact assembly 10 without rubbing or sliding against the electrical contacts 14, 16.

Although the invention has been described with reference to the exemplary embodiments illustrated in the attached drawings, it is noted that equivalents may be employed and substitutions made herein without departing from the scope of the invention as recited in the claims. The base 12 and the electrical contacts 14, 16, for example, may be constructed in various sizes and shapes without departing from the scope of the invention. Additionally, while the contact assembly 10 is particularly well suited for use as a Kelvin connector in a four-wire sensing circuit, the assembly 10 may be used in other circuits that benefit from dual contact assemblies or circuits that benefit from a contact assembly that minimizes wear on connector pins.

Having thus described various embodiments of the invention, what is claimed as new and desired to be protected by Letters Patent includes the following:

1. A contact assembly comprising:
   a base formed at least partially of an electrically nonconductive material;
   a first electrical contact supported by the base and configured to engage a first external conductive circuit element,
   the first electrical contact including a first segment rigidly secured to the base, a second segment configured to engage the first external conductive circuit element, and a plurality of intermediate segments between the first and second segments; and
   a second electrical contact supported by the base and configured to engage a second external conductive circuit element,
   the second electrical contact including a first segment rigidly secured to the base, a second segment configured to engage the second external conductive circuit element, and a plurality of intermediate segments between the first and second segments, the second electrical contact being separated from the first electrical contact by a space for at least partially disposing a conductive pin therebetween, the base being movable relative to the second segment of the first electrical contact and the second segment of the second electrical contact along an axis between a retracted position and an extended position when the second segment of the first electrical contact is engaged to the first external conductive element and the second segment of the second electrical contact is engaged to the second external conductive circuit element,
   the first electrical contact and the second electrical contact configured such that one of the plurality of intermediate segments of the first electrical contact and one of the plurality of intermediate segments of the second electrical contact are retained in a diverged position when the base is in the retracted position and a converged position when the base is in the extended position such that the first electrical contact and the second electrical contact do not engage the conductive pin when the base is in the retracted position and such that the first electrical contact and the second electrical contact engage the conductive pin when the base is in the extended position,
   the first electrical contact and the second electrical contact passing through the base, the second segment of the first electrical contact and the second segment of the second electrical contact extending perpendicular to the axis for contacting the external conductive circuit elements.

2. The contact assembly of claim 1,
   the second segment of the first electrical contact being positioned on a first side of the base,
   the second segment of the second electrical contact being positioned on a second side of the base opposite the first side.

3. The contact assembly of claim 1, the first electrical contact and the second electrical contact being configured such that at least one of the intermediate segments of each electrical contact flexes to allow the base to shift relative to the second segment of the first electrical contact and the second segment of the second electrical contact.

4. The contact assembly of claim 1,
   the base including—
      a first end and a second end separated along the axis, and
      an elliptical cross-section perpendicular to the axis,
   the second segment of the first electrical contact being positioned on a first side of the base and parallel with the elliptical cross-section,
   the second segment of the second electrical contact being positioned on a second side of the base opposite the first side and parallel with the elliptical cross-section.

5. The contact assembly of claim 4, the second segment of the first electrical contact and the second segment of the second electrical contact both being positioned between the first end of the base and the second end of the base.

6. The contact assembly of claim 4, the first end and the second end of the base being separated by a distance of 0.10 inches or less, and the electrical contacts being separated by a space of 0.10 inches or less when the contact assembly is in an open position.

7. The contact assembly of claim 4, each of the first electrical contact and the second electrical contact including a first portion extending from the first end of the base, a second portion inside the base, and a third portion extending from the second end of the base, the second portion including the first segment and the third portion including the second segment.

8. The contact assembly of claim 7, the first portion of each of the first electrical contact and the second electrical contact including a retention segment extending beyond a periphery of the first end of the base.

9. A printed circuit board comprising:
a plurality of apertures;
a plurality of conductive pads positioned on the printed circuit board such that a pair of conductive pads is associated with each aperture, each pair of conductive pads including a first conductive pad and a second conductive pad positioned on opposing sides of one of the apertures; and
a plurality of contact assemblies, each contact assembly slidably positioned in one of the apertures and including—
an electrically nonconductive base positioned at least partially in the aperture,
a first electrical contact supported by the base, the first electrical contact being a strip of metal with a first segment rigidly secured to the base, a second segment engaging the first conductive pad and forming an electrical connection with the pad, and a plurality of intermediate segments between the first and second segments, and
a second electrical contact supported by the base, the second electrical contact being a strip of metal with a first segment rigidly secured to the base, a second segment engaging the second conductive pad and forming an electrical connection with the pad, and a plurality of intermediate segments between the first and second segments,
the first electrical contact and the second electrical contact being configured such that at least one of the intermediate segments of each electrical contact flexes to allow the base to shift along an axis relative to the printed circuit board, and at least one of the intermediate segments of the first electrical contact and at least one of the intermediate segments of the second electrical contact converge as the base moves in a first direction along the axis relative to the circuit board and diverge as the base moves in a second direction along the axis that is substantially opposite the first direction relative to the circuit board,
the first electrical contact and the second electrical contact passing through the base, the second segment of the first electrical contact and the second segment of the second electrical contact extending perpendicular to the axis for contacting the pair of conductive pads.

10. The printed circuit board of claim 9, the first segment of the first electrical contact being fixedly attached to the first conductive pad and the first segment of the second electrical contact being fixedly attached to the second conductive pad.

11. The printed circuit board of claim 9, the electrical contacts of each of the contact assemblies being separated by a space of 0.10 inches or less when the respective contact assembly is in an open position.

12. The contact assembly of claim 9,
the base including—
a first end and a second end separated along the axis, and
an elliptical cross-section perpendicular to the axis,
the second segment of the first electrical contact being positioned on a first side of the base and parallel with the elliptical cross-section,
the second segment of the second electrical contact being positioned on a second side of the base opposite the first side and parallel with the elliptical cross-section.

13. The contact assembly of claim 12, the second segment of the first electrical contact and the second segment of the second electrical contact both being positioned between the first end of the base and the second end of the base.

14. The contact assembly of claim 12, the first end and the second end of the base being separated by a distance of 0.10 inches or less, and the electrical contacts being separated by a space of 0.10 inches or less when the contact assembly is in an open position.

15. The contact assembly of claim 12, each of the first electrical contact and the second electrical contact including a first portion extending from the first end of the base, a second portion inside the base, and a third portion extending from the second end of the base, the second portion including the first segment and the third portion including the second segment.

16. The contact assembly of claim 15,
the first portion of the first electrical contact including a retention segment extending beyond a periphery of the first end of the base in a first direction,
the first portion of the second electrical contact including a retention segment extending beyond the periphery of the first end of the base in a second direction opposite the first direction,
the retention segments configured to retain the contact assembly in the printed circuit board.

17. A method comprising:
placing a contact assembly in an aperture of a circuit board such that an electrically nonconductive base of the contact assembly is positioned at least partially in the aperture and each of two separate electrical contacts of the contact assembly engages a separate conductive pad on the circuit board;
connecting a pin-type connector to the contact assembly by inserting a pin of the connector between the two electrical contacts of the receptacle such that the pin engages the base without contacting either of the two electrical contacts;
moving the connector and the contact assembly in a first direction relative to the circuit board, causing the two electrical contacts to flex such that a portion of each contact converges on the pin and contacts the pin without contacting the other contact and without sliding on the pin; and
after the two electrical contacts initially make contact with the pin, moving the connector further in the first direction, causing the two electrical contacts to flex further without sliding on the pin.

18. The method of claim 17, further comprising moving the connector in a second direction opposite the first direction to cause the two electrical contacts to flex and diverge away from the pin, causing both of the contacts to separate from the pin without sliding on the pin.

19. A contact assembly comprising:
a base formed at least partially of an electrically nonconductive material, the base including:
a first end and a second end separated along an axis, and
an elliptical cross-section perpendicular to the axis;
a first electrical contact supported by the base and configured to engage a first external conductive circuit element,
the first electrical contact including a first segment rigidly secured to the base, a second segment configured to engage the first external conductive circuit element, and a plurality of intermediate segments between the first and second segments, the second segment of the first electrical contact being positioned on a first side of the base and parallel with the elliptical cross-section, the first electrical contact further including a first portion extending from the first end of the base, a second portion inside the base, and a third portion extending from the second end of the base, the second portion including the first segment and the third portion including the second segment; and a second electrical contact supported by the base and configured to engage a second external conductive circuit element, the second electrical contact including a first segment rigidly secured to the base, a second segment configured to engage the second external conductive circuit element, and a plurality of intermediate segments between the first and second segments, the second segment of the second electrical contact being positioned on a second side of the base opposite the first side and parallel with the elliptical cross-section, the second electrical contact further including a first portion extending from the first end of the base, a second portion inside the base, and a third portion extending from the second end of the base, the second portion of the second electrical contact including the first segment of the second electrical contact and the third portion of the second electrical contact including the second segment of the second electrical contact, the second electrical contact being separated from the first electrical contact by a space for at least partially disposing a conductive pin therebetween, the base being movable relative to the second segment of the first electrical contact and the second segment of the second electrical contact between a retracted position and an extended position when the second segment of the first electrical contact is engaged to the first external conductive element and the second segment of the second electrical contact is engaged to the second external conductive circuit element, the first electrical contact and the second electrical contact configured such that one of the plurality of intermediate segments of the first electrical contact and one of the plurality of intermediate segments of the second electrical contact are retained in a diverged position when the base is in the retracted position and a converged position when the base is in the extended position such that the first electrical contact and the second electrical contact do not engage the conductive pin when the base is in the retracted position and such that the first electrical contact and the second electrical contact engage the conductive pin when the base is in the extended position.

20. The contact assembly of claim 19, the first end and the second end of the base being separated by a distance of 0.10 inches or less, and the electrical contacts being separated by a space of 0.10 inches or less when the contact assembly is in an open position.

21. The contact assembly of claim 19, the first portion of each of the first electrical contact and the second electrical contact including a retention segment extending beyond a periphery of the first end of the base.

* * * * *